(12) United States Patent
Uchida

(10) Patent No.: US 7,458,047 B2
(45) Date of Patent: Nov. 25, 2008

(54) METHOD OF DESIGNING LAYOUT OF SEMICONDUCTOR INTEGRATED CIRCUIT AND APPARATUS FOR DOING THE SAME

(75) Inventor: Kohei Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 254 days.

(21) Appl. No.: 11/365,593

(22) Filed: Mar. 2, 2006

(65) Prior Publication Data

US 2006/0209614 A1 Sep. 21, 2006

(30) Foreign Application Priority Data

Mar. 17, 2005 (JP) .............................. 2005-076404

(51) Int. Cl.
*G06F 17/50* (2006.01)
(52) U.S. Cl. .................................. 716/5; 716/9; 716/10
(58) Field of Classification Search ...................... 716/5, 716/9, 10
See application file for complete search history.

(56) References Cited

U.S. PATENT DOCUMENTS

| | | | | |
|---|---|---|---|---|
| 5,631,492 | A * | 5/1997 | Ramus et al. ................ | 257/532 |
| 5,883,814 | A * | 3/1999 | Luk et al. ........................ | 716/2 |
| 6,037,621 | A * | 3/2000 | Wilson ........................ | 257/296 |
| 6,320,237 | B1 * | 11/2001 | Assaderaghi et al. ......... | 257/403 |
| 6,370,678 | B1 * | 4/2002 | Culler ........................... | 716/18 |
| 6,424,058 | B1 * | 7/2002 | Frech et al. ................... | 307/109 |
| 6,480,992 | B1 * | 11/2002 | Runyon ........................ | 716/10 |
| 6,608,365 | B1 * | 8/2003 | Li et al. ........................ | 257/532 |
| 6,635,916 | B2 * | 10/2003 | Aton ........................... | 257/306 |
| 6,777,304 | B2 * | 8/2004 | Assaderaghi et al. ......... | 438/394 |
| 6,897,505 | B2 * | 5/2005 | Aton ........................... | 257/296 |
| 6,980,414 | B1 * | 12/2005 | Sutardja ..................... | 361/306.3 |

(Continued)

FOREIGN PATENT DOCUMENTS

JP 11-168177 6/1999

(Continued)

OTHER PUBLICATIONS

Hiroshi et al., Japanese Patent No. JP 2001-351985, published on Dec. 21, 2001, translated in English using Automated English translation provided by the Japanese Patent Office, translated on Jan. 5, 2008, pp. 1-25.*

(Continued)

*Primary Examiner*—Phallaka Kik
(74) *Attorney, Agent, or Firm*—Young & Thompson

(57) ABSTRACT

A method of designing a layout of a functional block and an on-chip capacitor in a semiconductor integrated circuit, includes the steps of (a) designing a layout of a capacitor/block including a functional block, and an on-chip capacitor having a predetermined capacity and disposed adjacent to the functional block, (b) judging whether the layout resulted from the step (a) satisfies predetermined requirements, (c) designing again a layout of a capacitor/block including an on-chip capacitor having a capacity smaller than a capacity of an on-chip capacitor of the previously designed capacitor/block, only when the layout resulted from the step (a) is judged not to satisfy the predetermined requirements, and (d) judging whether the layout resulted from the step (c) satisfies the predetermined requirements. The steps (c) and (d) are repeatedly carried out until the layout satisfies the predetermined requirements.

19 Claims, 10 Drawing Sheets

U.S. PATENT DOCUMENTS

| | | | |
|---|---|---|---|
| 7,086,026 B2* | 8/2006 | Berry et al. | 716/10 |
| 7,116,544 B1* | 10/2006 | Sutardja | 361/306.3 |
| 7,346,877 B2* | 3/2008 | Berry et al. | 716/10 |
| 2001/0046125 A1* | 11/2001 | Rehm et al. | 361/760 |
| 2002/0008290 A1* | 1/2002 | Assaderaghi et al. | 257/403 |
| 2002/0024087 A1* | 2/2002 | Aton | 257/313 |
| 2004/0004241 A1* | 1/2004 | Aton | 257/306 |
| 2004/0075152 A1* | 4/2004 | Barna et al. | 257/421 |
| 2004/0199882 A1* | 10/2004 | Cao et al. | 716/4 |
| 2006/0200783 A1* | 9/2006 | Berry et al. | 716/5 |

FOREIGN PATENT DOCUMENTS

| | | |
|---|---|---|
| JP | 2001-351985 | 12/2001 |
| JP | 2004-86881 | 3/2004 |

OTHER PUBLICATIONS

Heydari et al., "Ground Bounce in Digital VLSI Circuits", IEEE Transactions on Very Large Scale Integration (VLSI) Systems, vol. 11, No. 2, Apr. 2003, pp. 180-193.*

Fu et al., "Decoupling Capacitor Allocation for Power Delivery Network Noise Reduction Based on Standard Cell Layouts", Proceedings of 5th International Conference on ASIC, vol. 1, Oct. 21-24, 2003, pp. 101-104.*

Ghonemia et al., "Formal Derivation of Optimal Active Shiedling for Low-Power On-Chip Buses", IEEE/ACM International Conference on Computer Aided Design, Nov. 7-11, 2004, pp. 800-807.*

Wang et al., "On-Chip Decoupling Capacitor Design to Reduce Switching Noise-Induced Instability in CMOS/SOI VLSI", Proceedings of 1995 IEEE International SOI Conference, Oct. 3-5, 1995, pp. 100-101.*

Pandini et al., "Design Methodologies and Architecture Solutions for High-Performance Interconnects", Proceedings of IEEE International Conference on Computer Design: VLSI in Computers and Processors, Oct. 11-13, 2004, pp. 152-159.*

* cited by examiner

FIG.4

PRIORITY LEVEL LIBRARY

UNIT BY WHICH REPLACEMENT
RATE IS INCREASED                    0.1%

| BLOCK NAMES | PRIORITY LEVEL |
|---|---|
| FIRST INVERTER | 1 |
| SECOND INVERTER | 2 |
| THIRD INVERTER | 3 |
| FIRST NAND | 1 |
| SECOND NAND | 1 |
| FIRST FLIP-FLOP | 4 |
| SECOND FLIP-FLOP | 4 |

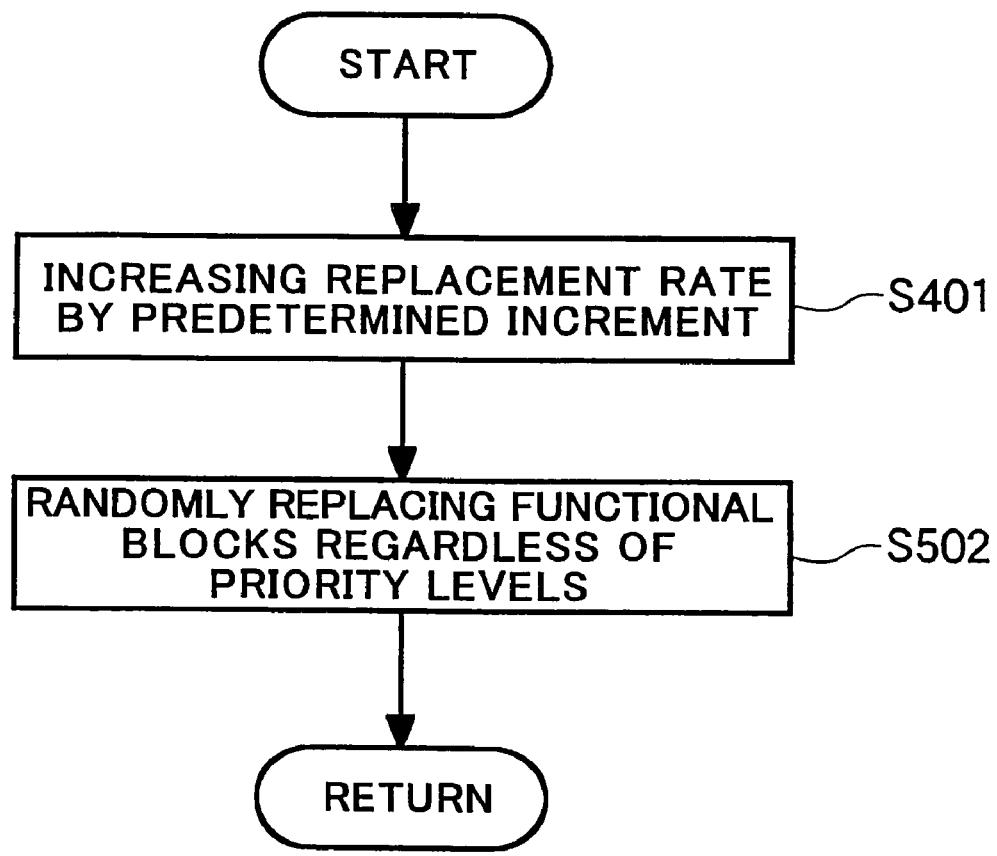

METHOD OF DESIGNING LAYOUT OF SEMICONDUCTOR INTEGRATED CIRCUIT AND APPARATUS FOR DOING THE SAME

BACKGROUND OF THE INVENTION

1. Field of the Invention

The invention relates to a method of designing a layout of a semiconductor integrated circuit, a program for causing a computer to carry out the method, a method of fabricating a semiconductor integrated circuit, and an apparatus for designing a layout of a semiconductor integrated circuit.

2. Description of the Related Art

An internal circuit in a semiconductor integrated circuit such as LSI (Large Scale Integration) is accompanied with a problem that electrical noises generated when the internal circuit operates cause fluctuation in delay and malfunction.

For instance, such electrical noises are caused by fluctuation in a voltage of a power-source line, generated when a transistor is turned on or off.

Such electrical noises can be reduced by means of an on-chip capacitor arranged in LSI.

For instance, Japanese Patent Application Publication No. 11-168177 (June, 1999) has suggested a method of arranging a functional block and an on-chip capacitor in LSI.

FIG. 1 is a flow chart showing steps to be carried out in the method.

As illustrated in FIG. 1, first, functional blocks are placed so as to satisfy requirements such as connection in a net list, a given delay, and a density of functional blocks, in step S201.

Then, there are fabricated on-chip capacitors each having a size equal to or smaller than a size of each of spaces where functional blocks were not arranged, and the thus fabricated on-chip capacitors are arranged in the spaces, in step S202.

Then, the functional blocks are routed, that is, electrically connected to one another through wires, in step S203.

In the method shown in FIG. 1, a layout of the functional blocks is designed (step S201) before a layout of the on-chip capacitors is designed (step S202).

As described in the above-mentioned Publication, an on-chip capacitor is preferably disposed in the vicinity of a functional block in order to reduce electrical noises.

However, the method suggested in the above-mentioned Publication is accompanied with a problem that since an on-chip capacitor is disposed in a space where functional blocks have not been arranged, it is not always for an on-chip capacitor to be disposed in the vicinity of a functional block, resulting in insufficient reduction in electrical noises.

Furthermore, the method suggested in the above-mentioned Publication is accompanied further with a problem that functional blocks are arranged in excessively high integration. In the case that a layout of on-chip capacitors is designed after a layout of functional blocks has been determined in excessively high integration, it would not be possible to arrange on-chip capacitors with sufficient space being left between adjacent functional blocks. This results in insufficient reduction in electrical noises.

Japanese Patent Application Publication No. 2001-351985 has suggested a method of designing a layout of a semiconductor integrated circuit. In the method, there are prepared a first library including no bypass capacitor, a second library including a bypass capacitor having a small capacity, and a third library including a bypass capacitor having a high capacity, for one logic including data indicative of a size of a transistor. The third library is used for a logic having a high toggle rate, and the second library is used for a logic having a small toggle rate.

Japanese Patent Application Publication No. 2004-86881 has suggested an apparatus for designing a semiconductor integrated circuit. The apparatus receives data relating to a gate level logic circuit of circuit blocks in LSI chip, data relating to standard cell library, and data relating to a package, and analyzes noises of the LSI chip in accordance with the received data. If noises are within an allowable range, the apparatus continues analyzing noises. If noises are without an allowable range, the apparatus selects one of logic gates in circuit blocks, and add a bypass capacitor to the selected logic gate.

SUMMARY OF THE INVENTION

In view of the above-mentioned problems in the prior art, it is an object of the present invention to provide a method of designing a layout of a semiconductor integrated circuit which is capable of further reducing electrical noises in comparison with the conventional method.

It is also an object of the present invention to provide a program for causing a computer to carry out the method.

It is also an object of the present invention to provide a method of fabricating a semiconductor integrated circuit which is capable of further reducing electrical noises in comparison with the conventional method.

It is also an object of the present invention to provide an apparatus for designing a layout of a semiconductor integrated circuit which is capable of further reducing electrical noises in comparison with the conventional method.

In one aspect of the present invention, there is provided a method of designing a layout of a functional block and an on-chip capacitor in a semiconductor integrated circuit, including the steps of (a) designing a layout of a capacitor/block comprised of a functional block, and an on-chip capacitor having a predetermined capacity and disposed adjacent to the functional block, (b) judging whether the layout resulted from the step (a) satisfies predetermined requirements, (c) designing again a layout of a capacitor/block including an on-chip capacitor having a capacity smaller than a capacity of an on-chip capacitor of the previously designed capacitor/block, only when the layout resulted from the step (a) is judged not to satisfy the predetermined requirements, and (d) judging whether the layout resulted from the step (c) satisfies the predetermined requirements, the steps (c) and (d) being repeatedly carried out until the layout satisfies the predetermined requirements.

For instance, the predetermined requirements include at least one of accommodation capacity and delay.

The method may further include the step (e) of judging, if the layout is judged not to satisfy the predetermined requirements in the step (b), whether a reason why the layout does not satisfy the predetermined requirements lies in a large size of an on-chip capacitor of the capacitor/block, wherein the steps (c) and (d) are carried out when it is judged in the step (e) that the reason lies in a large size of the on-chip capacitor.

The method may further include the step (f) of preparing a plurality of libraries for each of capacitor/blocks each including on-chip capacitors having capacities different from one another in association with each of functional blocks, wherein a library of a capacitor/block including an on-chip capacitor having a maximum capacity in each of functional blocks is selected, and then, a layout is designed in the step (a), and the library is replaced with a library of a capacitor/block including an on-chip capacitor having a capacity smaller than the maximum capacity, in a certain functional block among the functional blocks, and then, a layout is designed in the step (c).

For instance, the step (c) may include (c1) setting one of a number of functional blocks in which a library should be replaced with another library a capacitor/block including an on-chip capacitor having a smaller capacity, and a target rate defined as X/Y wherein X indicates a number of functional blocks in which a library should be replaced with another library of a capacitor/block including an on-chip capacitor having a smaller capacity, and Y indicates a total number of functional blocks, and (c2) repeating the replacement of a library until the number of functional blocks is replaced with the another library or until the target rate is accomplished.

For instance, the target rate is increased by a predetermined rate in the step (c1) each time the step (c) is carried out.

The method may further include the step (g) of assigning priority level to each of functional blocks, wherein, in the step (c2), a library is replaced with another library of a capacitor/block including an on-chip capacitor having an immediately smaller capacity in an order of a functional block having a smaller priority level among the functional blocks, in the case that the target rate is not accomplished even if the replacement of a library is repeatedly carried out for a functional block having a smallest priority level to a functional block having a highest priority level, the replacement of a library with another library of a capacitor/block including an on-chip capacitor having a second immediately smaller capacity in an order of a functional block having a smaller priority level among the functional blocks is carried out until the target rate is accomplished.

The method may further include the step (g) of assigning priority level to each of functional blocks, wherein, in the step (c2), a library is replaced with another library of a capacitor/block including an on-chip capacitor having an immediately smaller capacity in a functional block having a first priority level, in the case that the target rate is not accomplished even if the functional block having the first priority level is replaced with a library of a capacitor/block including an on-chip capacitor having a minimum capacity, the replacement of a library with another library of a capacitor/block including an on-chip capacitor having a second priority level immediately higher than the first priority level is carried out.

For instance, the replacement is repeatedly carried out in the step (c2) randomly in each of the functional blocks, until the target rate is accomplished.

In another aspect of the present invention, there is provided a program for causing a computer to carry out a method of designing a layout of a functional block and an on-chip capacitor in a semiconductor integrated circuit, steps executed by the computer in accordance with the program including (a) designing a layout of a capacitor/block comprised of a functional block, and an on-chip capacitor having a predetermined capacity and disposed adjacent to the functional block, (b) judging whether the layout resulted from the step (a) satisfies predetermined requirements, (c) designing again a layout of a capacitor/block including an on-chip capacitor having a capacity smaller than a capacity of an on-chip capacitor of the previously designed capacitor/block, only when the layout resulted from the step (a) is judged not to satisfy the predetermined requirements, and (d) judging whether the layout resulted from the step (c) satisfies the predetermined requirements, the steps (c) and (d) being repeatedly carried out until the layout satisfies the predetermined requirements.

In still another aspect of the present invention, there is provided a method of fabricating a semiconductor integrated circuit including a functional block and an on-chip capacitor both formed on a substrate or an electrically insulating layer, including arranging the functional block and the on-chip capacitor on the substrate or the electrically insulating layer in accordance with a layout, the layout being determined by (a) designing a layout of a capacitor/block comprised of a functional block, and an on-chip capacitor having a predetermined capacity and disposed adjacent to the functional block, (b) judging whether the layout resulted from the step (a) satisfies predetermined requirements, (c) designing again a layout of a capacitor/block including an on-chip capacitor having a capacity smaller than a capacity of an on-chip capacitor of the previously designed capacitor/block, only when the layout resulted from the step (a) is judged not to satisfy the predetermined requirements, and (d) judging whether the layout resulted from the step (c) satisfies the predetermined requirements, the steps (c) and (d) being repeatedly carried out until the layout satisfies the predetermined requirements.

In yet another aspect of the present invention, there is provided an apparatus for designing a layout of a functional block and an on-chip capacitor in a semiconductor integrated circuit, including (a) a placer which designs a layout of a capacitor/block comprised of a functional block, and an on-chip capacitor having a predetermined capacity and disposed adjacent to the functional block, (b) a judgment device which judges whether the layout determined by the placer satisfies predetermined requirements, and (c) a replacement device which replaces an on-chip capacitor with another on-chip capacitor having a smaller capacity, when the layout is judged not to satisfy the predetermined requirements, wherein the placer, only when the layout is judged not to satisfy the predetermined requirements, designs a layout of a capacitor/block including an on-chip capacitor having a capacity smaller than a capacity of an on-chip capacitor of the previously designed capacitor/block.

For instance, the judgment device may include at least one of a first device which judges whether the layout designed by the placer satisfies accommodation capacity, and a second unit which judges whether the layout designed by the placer satisfies delay.

The apparatus may further include a judgment device which judges, if the layout is judged not to satisfy the predetermined requirements, whether a reason why the layout does not satisfy the predetermined requirements lies in a large size of an on-chip capacitor of the capacitor/block, wherein replacement device, when the reason is judged to lie in a large size of an on-chip capacitor of the capacitor/block, replaces an on-chip capacitor with another on-chip capacitor having a smaller capacity.

The apparatus may further include library database storing therein a plurality of libraries for each of capacitor/blocks each including on-chip capacitors having capacities different from one another in association with each of functional blocks, wherein the placer designs a layout, selecting a library of a capacitor/block including an on-chip capacitor having a maximum capacity in each of functional blocks, and the replacement device replaces the library with a library of a capacitor/block including an on-chip capacitor having a capacity smaller than the maximum capacity, in a certain functional block among the functional blocks.

The apparatus may further include a target-rate setting device which determines one of a number of functional blocks in which a library should be replaced with another library a capacitor/block including an on-chip capacitor having a smaller capacity, and a target rate defined as X/Y wherein X indicates a number of functional blocks in which a library should be replaced with another library of a capacitor/block including an on-chip capacitor having a smaller capacity, and Y indicates a total number of functional blocks, wherein the replacement device repeats the replacement of a library until the number of functional blocks is replaced with the another library or until the target rate is accomplished.

The apparatus may further include priority level database storing therein a priority level of each of the functional blocks, wherein the replacement device replaces a library with another library of a capacitor/block including an on-chip capacitor having an immediately smaller capacity in an order of a functional block having a smaller priority level among the functional blocks, in the case that the target rate is not accomplished even if the replacement of a library is repeatedly carried out for a functional block having a smallest priority level to a functional block having a highest priority level, the replacement device carries out the replacement of a library with another library of a capacitor/block including an on-chip capacitor having a second immediately smaller capacity in an order of a functional block having a smaller priority level among the functional blocks, until the target rate is accomplished.

The apparatus may further include priority level database storing therein a priority level of each of the functional blocks, wherein the replacement device replaces a library with another library of a capacitor/block including an on-chip capacitor having an immediately smaller capacity in a functional block having a first priority level, in the case that the target rate is not accomplished even if the functional block having the first priority level is replaced with a library of a capacitor/block including an on-chip capacitor having a minimum capacity, the replacement device carries out the replacement of a library with another library of a capacitor/block including an on-chip capacitor having a second priority level immediately higher than the first priority level.

For instance, the replacement device repeatedly carries out the replacement randomly in each of the functional blocks, until the target rate is accomplished.

The advantages obtained by the aforementioned present invention will be described hereinbelow.

In the method in accordance with the present invention, only when a layout is judged not to satisfy the predetermined requirements, a layout of a capacitor/block including an on-chip capacitor having a capacity smaller than a capacity of an on-chip capacitor of the previously designed capacitor/block is designed, and then, the thus designed layout is judged as to whether it satisfies the predetermined requirements. The designing a layout and the judgment of the layout are repeatedly carried out until the layout satisfies the predetermined requirements. Accordingly, it is possible to present a capacitor/block including an on-chip capacitor having a maximum capacity with the predetermined requirements being satisfied.

Specifically, only when the requirements such as accommodation capacity and delay are not satisfied, a capacitor/block including an on-chip capacitor having a first capacity is replaced with a capacitor/block including an on-chip capacitor having a second capacity smaller than the first capacity. Accordingly, as long as the requirements such as accommodation capacity and delay are satisfied, an on-chip capacity having a maximum capacity is disposed adjacent to a functional block.

Thus, since an on-chip capacitor can present its maximum performance, it would be possible to suppress problems such as delay deterioration and malfunction both caused by electrical noises.

Even if the requirements such as accommodation capacity and delay are not satisfied, a capacitor/block including an on-chip capacitor having a first capacity is replaced with a capacitor/block including an on-chip capacitor having a second capacity smaller than the first capacity, and hence, the delay and accommodation capacity are not deteriorated.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 4 illustrates an example of what is stored in priority level library database.

FIG. 10 is a flow chart showing steps to be carried out when a functional block is replaced with another functional block in the apparatus in accordance with the third embodiment of the present invention.

DESCRIPTION OF THE PREFERRED EMBODIMENTS

Preferred embodiments in accordance with the present invention will be explained hereinbelow with reference to drawings.

First Embodiment

In the first embodiment, an on-chip capacitor is disposed adjacent to a functional block, and there is prepared a library of capacitor/blocks in each of which a functional block and an on-chip capacitor are integral with each other.

On-chip capacitors having different sizes from one another are added to functional blocks having the same function. That is, there are prepared libraries of a plurality of capacitor/blocks wherein each of the libraries includes a functional block having a different function from functions of functional blocks in other libraries, and on-chip capacitors having sizes different from one another.

An example relation among libraries, functional blocks and on-chip capacitors is shown in Table 1.

TABLE 1

| Libraries | Functional Blocks | On-chip Capacitors |
|---|---|---|
| No. 1 to No. M | No. 1 | No. 1 to No. M |
| No. (M + 1) to No. 2M | No. 2 | No. 1 to No. M |
| . | . | . |
| . | . | . |
| . | . | . |
| No. ((L − 1)M + 1) to No. LM | No. L | No. 1 to No. M |

As shown in Table 1, each of the L functional blocks includes M on-chip capacitors, for instance. The L functional blocks have functions different from one another. The M on-chip capacitors have sizes different from one another. Specifically, an on-chip capacitor No. X is larger in size than an on-chip capacitor No. (X+1), wherein X=1, 2, 3, . . . , (M−1).

Assuming that there are L functional blocks and M on-chip capacitors as shown in Table 1, there would be LM libraries.

A layout of capacitor/blocks is designed through the use of the libraries. If the designed layout fails to meet requirements such as delay, a functional block including an on-chip capacitor having a smaller size than a size of an on-chip capacitor of the previously designed functional block is selected.

Accordingly, as long as a layout meets the requirements, an on-chip capacitor having a size as large as possible is disposed adjacent to a functional block.

Figure 1:
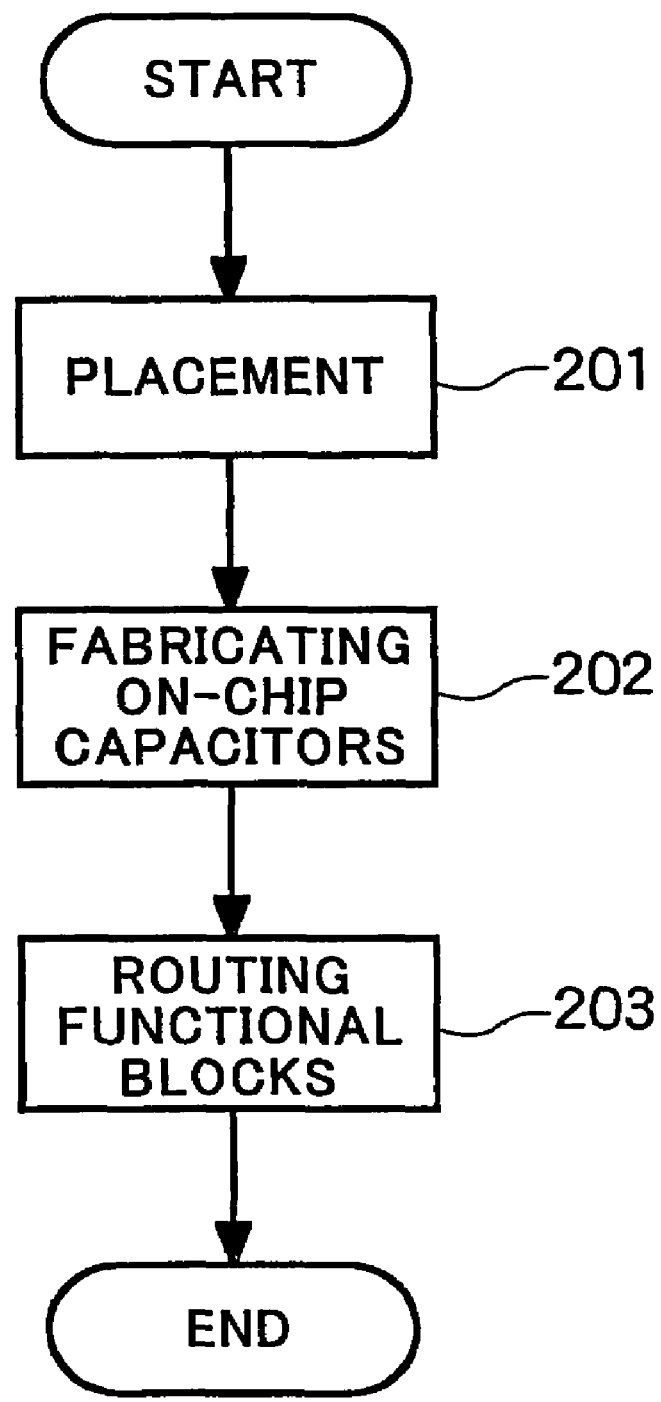
FIG. 1 is a flow chart showing steps to be carried out in a conventional method of arranging functional blocks.
Figure 2:
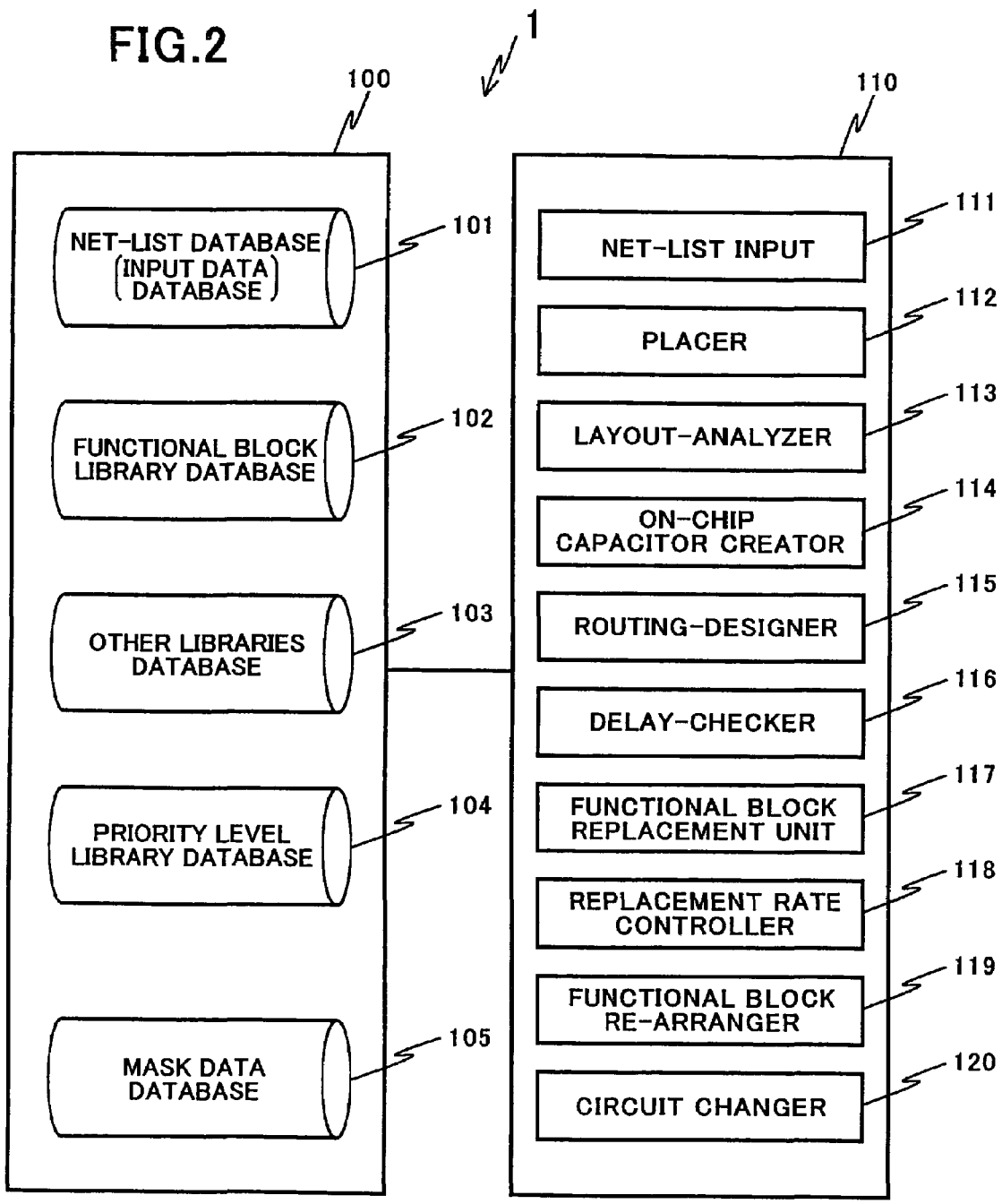
FIG. 2 is a block diagram of an apparatus for arranging functional blocks, in accordance with the first embodiment of the present invention.

FIG. 2 is a block diagram of an apparatus 1 for arranging functional blocks, in accordance with the first embodiment of the present invention.

The apparatus 1 is used to design a layout of functional blocks on a substrate or an electrically insulating layer of a semiconductor integrated circuit such as LSI.

As illustrated in FIG. 2, the apparatus 1 is comprised of a memory 100 storing various data therein, and a controller 110 designing a layout of functional blocks in dependence on data stored in the memory 100.

The apparatus 1 for arranging functional blocks is comprised of a computer-aided design (CAD) unit, for instance. For instance, the apparatus 1 includes a display unit (not illustrated) controlled by the controller 110 to display various images thereon, and an interface (not illustrated) through which a user operates the apparatus, apart from the memory 100 and the controller 110.

The memory 100 supplies data to the controller 110. The memory 100 stores therein net-list database 101, functional block library database 102, other libraries database 103, priority level library database 104, and mask data database 105.

The net-list database 101 stores a net list in which data about connection between functional blocks is written.

The functional block library database 102 stores therein libraries of capacitor/blocks comprised of functional blocks having different functions from one another and on-chip capacitors having sizes from one another.

Figure 3:
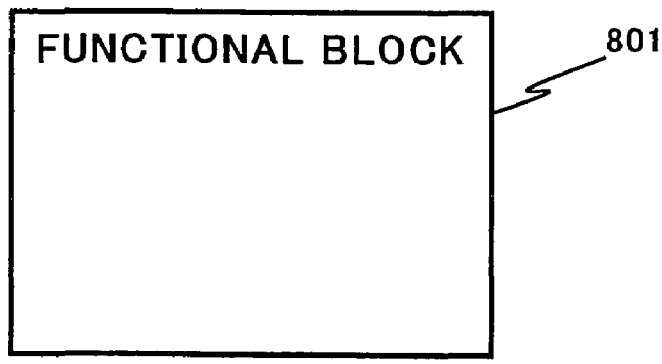
FIG. 3 illustrates an example of what is stored in functional block library database.
Figure 3:
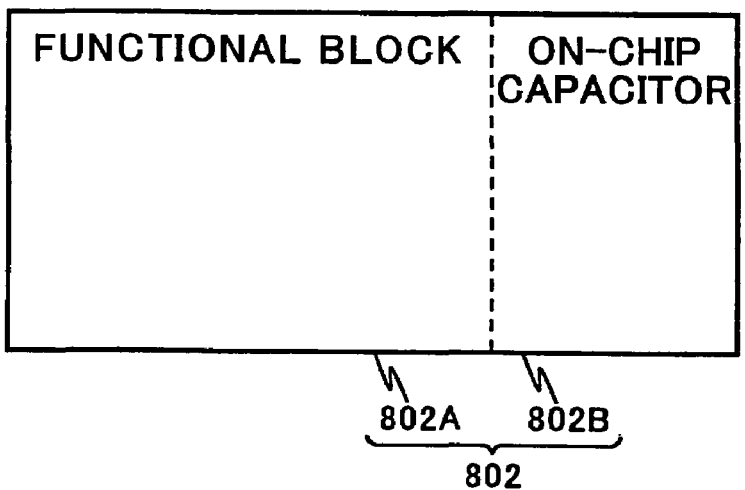
Figure 3:
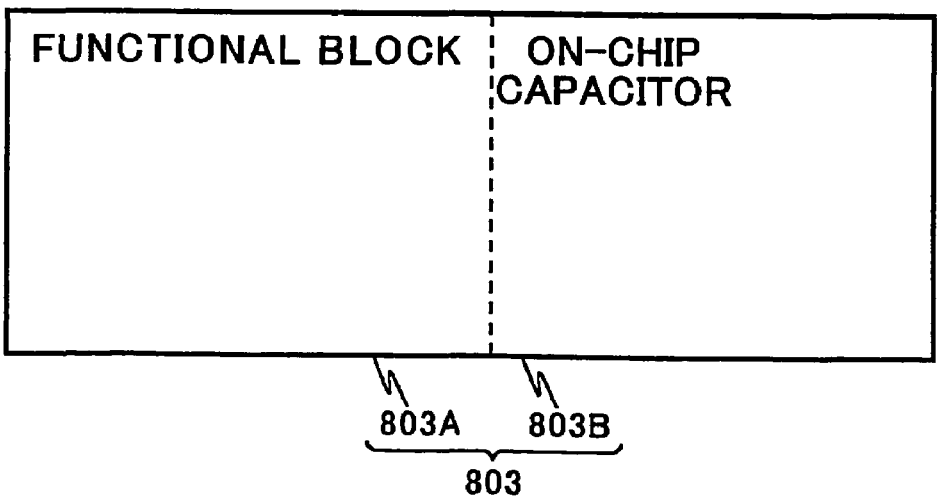

FIG. 3 illustrates an example of what is stored in the functional block library database 102.

For instance, as illustrated in FIG. 3, the functional block library database 102 stores therein a library including capacitor/blocks 803 having functional blocks 803A having different functions from one another, each of the functional blocks 803A being associated with an on-chip capacitor 803B having a relatively high capacity, and a library including capacitor/blocks 802 having functional blocks 802A having different functions from one another, each of the functional blocks 802A being associated with an on-chip capacitor 802B having a relatively small capacity.

Since an on-chip capacitor having a higher capacity is larger in size, a functional block to which an on-chip capacitor having a higher capacity is added is larger in size.

As illustrated in FIG. 3, the functional block library database 102 may further store a library including functional blocks 801 to which any on-chip capacitor is not added, where the functional blocks 801 have different functions from one another.

For instance, assuming that there are ten functional blocks having different functions from one another, the functional block library database 102 stores three libraries for each of the ten functional blocks. Namely, the functional block library database 102 stores totally thirty libraries. For instance, the functional block library database 102 stores therein, for each of the ten functional blocks, a library including the functional block 801 to which any on-chip capacitor is not added, a library including the capacitor/block 802 comprised of the functional block 802A and the on-chip capacitor 802B having a relatively small capacity, and a library including the capacitor/block 803 comprised of the functional block 803A and the on-chip capacitor 803B having a relatively high capacity.

In the first embodiment, it is assumed for simplification that a number of sizes of on-chip capacitors to be added to each of ten functional blocks is two (2). However, a number of on-chip capacitors to be added to each of functional blocks is not to be limited to two (2). Any number of on-chip capacitors such as ten, hundred, thousand or ten thousand on-chip capacitors may be added to each of functional blocks.

In the first embodiment, the functional block library database 102 is designed to store a library including the functional block 801 to which any on-chip capacitor is not added. However, the functional block library database 102 may be designed not to store a library including the functional block 801 to which any on-chip capacitor is not added.

The other libraries database 103 stores therein libraries used for designing a layout of LSI, except libraries stored in the functional block library database 102.

FIG. 4 illustrates an example of what is stored in the priority level library database 104.

As illustrated in FIG. 4, the priority level library database 104 stores data indicative of a priority level for each of functional blocks.

In accordance with a rule of assignment of a priority level to a functional block, a higher priority level is assigned to a functional block to which an on-chip capacitor having a higher capacity is preferably added.

The priority level library database 104 further stores data indicative of a unit by which a later-mentioned replacement rate is increased.

The mask data database 105 stores therein data identical with what is called "mask data" used for designing a layout of LSI.

Figure 5:
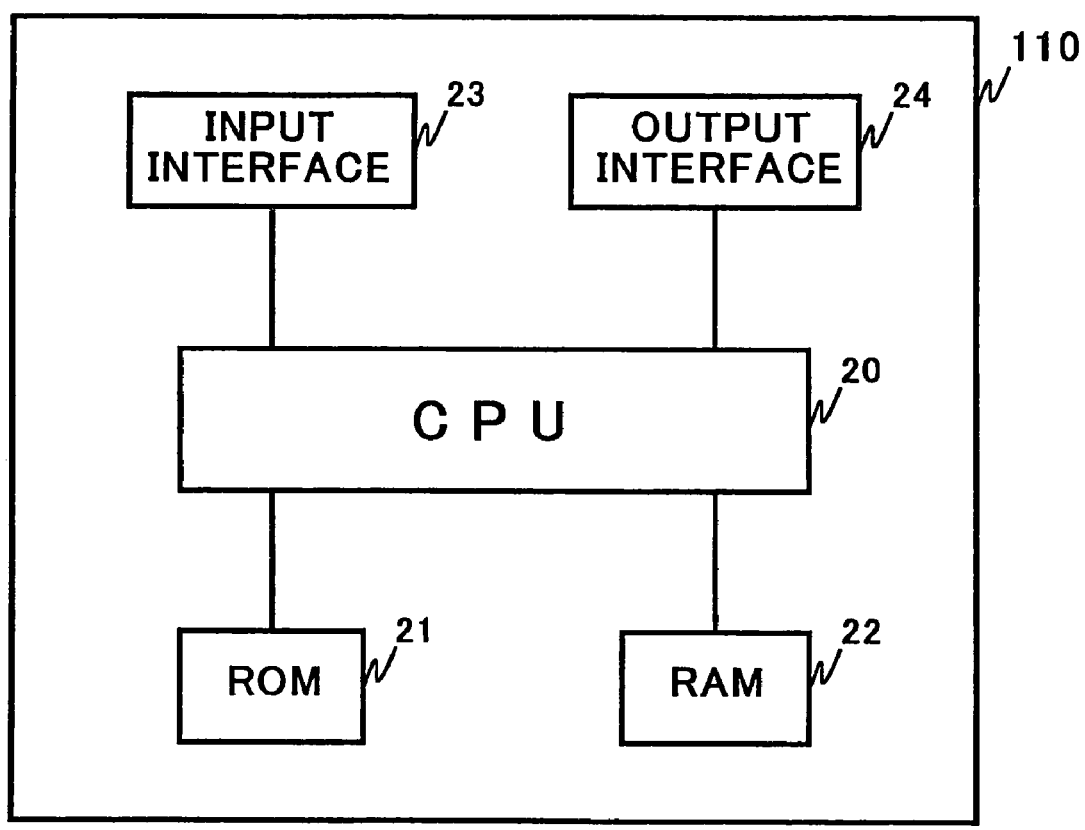
FIG. 5 is a block diagram of an example of the controller in the apparatus in accordance with the first embodiment of the present invention.

FIG. 5 is a block diagram of an example of a structure of the controller 110.

As illustrated in FIG. 5, the controller 110 is comprised of a central processing unit 20, a first memory 21, a second memory 22, an input interface 23 through which a command and/or data is input into the central processing unit 20, and an output interface 24 through which a result of steps having been executed by the central processing unit 20 is output.

Each of the first and second memories 21 and 22 is comprised of a semiconductor memory such as a read only memory (ROM), a random access memory (RAM) or an IC memory card, or a storage device such as a flexible disc, a hard disc or an optic magnetic disc.

The first memory 23 in the first embodiment is comprised of ROM, and stores therein a program for causing a computer to carry out a method of designing a layout of a functional block and an on-chip capacitor in a semiconductor integrated circuit. The second memory 25 in the first embodiment is comprised of RAM, stores therein various data and parameters, and presents a working area to the central processing unit 20. The central processing unit 20 reads the program out of the first memory 21, and executes the program. Thus, the central processing unit 20 operates in accordance with the program stored in the first memory 21.

The controller 110 acts as a net-list input 111, a placer 112, a layout-analyzer 113, an on-chip capacitor creator 114, a routing-designer 115, a delay-checker 116, a functional block replacement unit 117, a replacement rate controller 118, a functional block re-arranger 119, or a circuit re-designer 120.

The net-list input 111 takes a net list out of the net-list database 101 stored in the memory 100.

The placer 112 arranges or places functional blocks such that a delay among the functional blocks and concentration of wires are optimized, in accordance with data indicative of connection among the functional blocks, stored in the net list received from the net-list database 101 through the net-list input 111.

The layout-analyzer 113 judges whether functional blocks indicated in the net list are arranged in predetermined areas, and further, analyzes, if the functional blocks are not arranged in predetermined areas, that is, if the functional blocks overflow from predetermined areas, a reason why the functional blocks are not arranged in predetermined areas.

The on-chip capacitor creator 114 fabricates an on-chip capacitor matching to a size of a space formed between functional blocks, and arranges the thus fabricated on-chip capacitor in the space.

The routing-designer 115 electrically connects functional blocks arranged or placed by the placer 112 to one another through wires in accordance with the net list.

The delay-checker 116 calculates a delay in a circuit comprised of the functional blocks arranged or placed by the placer 112 and electrically connected to one another by the routing-designer 115, judges whether the thus calculated delay is within a target range, and analyzes, if the delay is not within a target range, a reason why the delay is not within a target range.

The functional block replacement unit 117 replaces a presently selected capacitor/block, with reference to the functional block library database 103, with another capacitor/block including an on-chip capacitor having a capacity smaller than a capacity of an on-chip capacitor of the presently selected capacitor/block.

The replacement rate controller 118 administrates a present replacement rate, and increases a replacement rate by a predetermined increment each time predetermined requirements are satisfied.

In the first embodiment, the term "replacement rate" indicates a rate defined as X/Y wherein X indicates a number of functional blocks which are necessary to have either an on-chip capacitor having a smaller capacity or no on-chip capacitor in place of an on-chip capacitor having a maximum capacity, and Y indicates a total number of functional blocks.

For instance, assuming that a number of functional blocks stored in the net list is ten thousand, and a replacement rate is 10%, it would be necessary to replace thousand capacitor/blocks including an on-chip capacitor having a first capacity with another capacitor/blocks including either an on-chip capacitor having a second capacity smaller than the first capacity or no on-chip capacitor.

If a capacitor/block 803 including an on-chip capacitor 803B having a relatively high capacity is replaced with a capacitor/block 802 including an on-chip capacitor 802B having a relatively small capacity, "one" replacement is counted.

It is assumed that a capacitor/block 803 including an on-chip capacitor 803B having a relatively high capacity is replaced with a capacitor/block 802 including an on-chip capacitor 802B having a relatively small capacity, and then, the capacitor/block 802 is replaced with the functional block 801 including no on-chip capacitor. In this case, when the first replacement is carried out, "one" replacement is counted, and then, when the second replacement is carried out "one" replacement is further counted. That is, when the capacitor/block 803 is replaced with the capacitor/block 802, and then, the capacitor/block 802 is replaced with the functional block 801, "two" replacement is counted.

Accordingly, a number of capacitor/blocks to be replaced with other capacitor/blocks in accordance with a replacement rate corresponds to a total number of replacement.

The functional block re-arranger 119 re-arranges or sorts functional blocks indicated in the net list, in accordance with a priority level in a descending order with reference to the priority level library database 104.

The circuit changer 120 rewrites data stored in the net-list database 101.

The placer 112, the on-chip capacitor creator 114, the routing-designer 115, the functional block replacement unit 117 and the circuit changer 120 do not actually design a layout, fabricate an on-chip capacitor, design a wiring layout, replace a functional block with another or change a circuit. They merely carry out simulation for designing a layout of a semiconductor integrated circuit.

Figure 6:
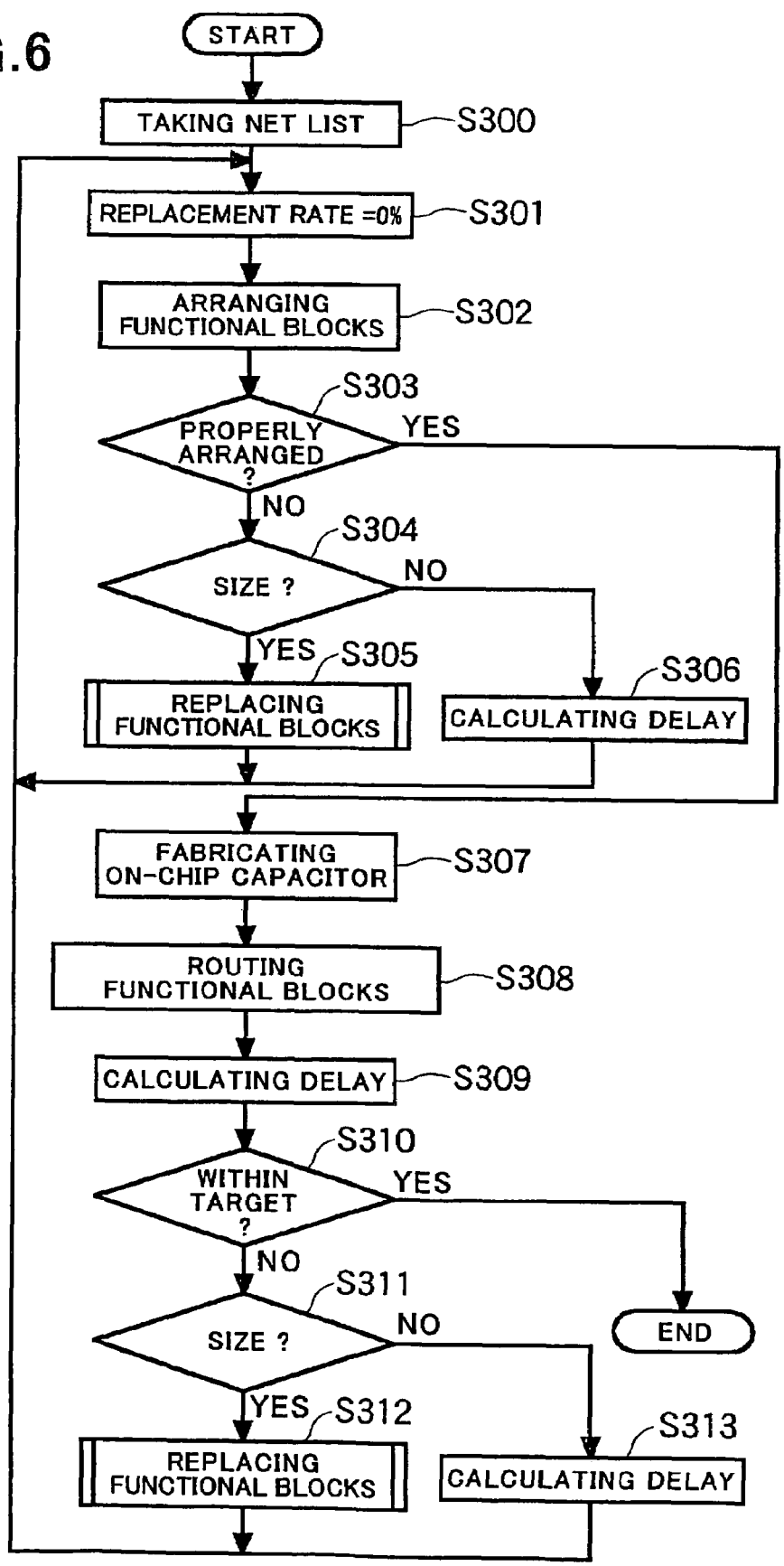
FIG. 6 is a flow chart showing steps to be carried out in the operation of the apparatus in accordance with the first embodiment of the present invention.

FIG. 6 is a flow chart showing steps to be carried out in operation of the apparatus 1.

Hereinbelow is explained the operation of the apparatus 1.

First, the controller 110 acts as the net-list input 111 to take a net list out of the net-list database 101 in step S300.

In initial condition, a capacitor having a maximum capacity is added to each of functional blocks indicated in the net-list database 101. For instance, each of functional blocks 803A indicated in the net-list database 101 is combined with an on-chip capacitor 803B having a relatively high capacity to define the capacitor/block 803.

Then, the controller 110 acts as the replacement rate controller 118 to reset a replacement rate, that is, set a replacement rate indicated in the net-list database 101 equal to be 0% in step S301.

The reason why a replacement rate is initially set equal to 0% is to first select a capacitor/block including a capacitor having a maximum capacity.

Then, the controller 110 acts as the placer 112 to arrange or place the functional blocks in a semiconductor integrated circuit such that a delay and a wiring density among the functional blocks are optimized, in accordance with data indicative of connection among functional blocks, stored in the net-list database 101, in step S302.

Then, the controller 110 acts as the layout-analyzer 113 to judge whether all of the functional blocks are arranged in predetermined areas, in step S303.

If all of the functional blocks are judged not to be arranged in predetermined areas, that is, if the functional blocks are judged to overflow out of predetermined areas (NO in step S303), the layout-analyzer 113 further judges whether a reason of this lies in a size of the functional blocks, in step S304.

If the reason lies in a size of the functional blocks (YES in step 304), the controller 110 acts as the functional block replacement unit 117 to replace the presently selected functional blocks with other functional blocks, in step S305.

Then, the steps S302, S303 and S304 are repeatedly carried out. Namely, the replacement of the functional blocks with other functional blocks in step S305 is carried out each time a reason why functional blocks overflow out of predetermined areas lies in a size of the functional blocks.

If the reason does not lie in a size of the functional blocks (NO in step S304), the controller 110 acts as the circuit changer 120 to update the net list by carrying out steps generally carried out in designing a layout of LSI such as re-designing a circuit diagram and/or re-arranging logics, in step S306.

Then, the steps S302 and the subsequent steps are repeatedly carried out.

If the functional blocks are judged to be arranged in the predetermined areas (YES in step S303), the controller 10 acts as the on-chip capacitor creator 114 to fabricate on-chip capacitors, in step S307.

Herein, an on-chip capacitor fabricated by the on-chip capacitor creator 114 is different from an on-chip capacitor to be added to a functional block, and is arranged in a space similarly to a conventional on-chip capacitor, resulting in that the on-chip capacitor is not always disposed adjacent to a functional block.

In accordance with the first embodiment, as long as requirements such as a delay and/or a density are satisfied, an on-chip capacitor having a maximum capacity is disposed either adjacent to a functional block or in a space.

Then, the controller 110 acts as the routing-designer 115 to route all of the functional blocks or electrically connect all of the functional blocks to one another through wires in accordance with the net list, in step S308.

Then, the controller 110 acts as the delay-checker 116 to check a delay. Specifically, the delay-checker 116 first calculates a delay in a circuit in accordance with the arrangement of the functional blocks in step S309, and then, judges whether the thus calculated delay is within a target range in step S310.

The steps 309 and 310 are carried out in a conventional process as used for designing a layout of LSI.

If a delay is not within a target range (NO in step S310), the delay-checker 116 judges whether a reason why a delay is not within a target range lies in long wiring length caused by a size of the functional blocks, in step S311.

If the above-mentioned reason is judged to lie in long wiring length caused by a size of the functional blocks (YES in step S311), the controller 110 acts as the functional block replacement unit 117 to replace the functional blocks with other functional blocks in step S312.

Then, the step S302 and the subsequent steps are repeatedly carried out.

The replacement of the functional blocks with other functional blocks (step S305) is repeatedly carried out each time a reason why a delay is not within a target range is judged to lie in a size of the functional blocks. In contrast, the replacement of the functional blocks with other functional blocks (step S312) is repeatedly carried out each time a reason why the functional blocks overflow predetermined areas is judged to lie in a size of the functional blocks or a reason why a delay is not within a target range is judged to lie in a size of the functional blocks.

The reason why a delay is not within a target range is judged to lie anything but a size of the functional blocks (NO in step S311), the controller 110 acts as the circuit changer 120 to update the net list by carrying out steps generally carried out in designing a layout of LSI such as re-designing a circuit diagram and/or re-arranging logics, in step S313.

Then, the steps S302 and the subsequent steps are repeatedly carried out.

If all of the functional blocks are judged not to be arranged in predetermined areas, that is, if the functional blocks are judged to overflow out of predetermined areas (NO in step S303), or if a delay is not within a target range (NO in step S310), the replacement of the functional blocks (step S302) may be carried out again in entirety, or may be carried out only partially with the aid of engineering change order (ECO) process which is generally carried out in designing a layout of LSI.

If a delay is within a target range (YES in step S310), the steps shown in FIG. 6 for designing a layout of the functional blocks are finished.

Figure 7:
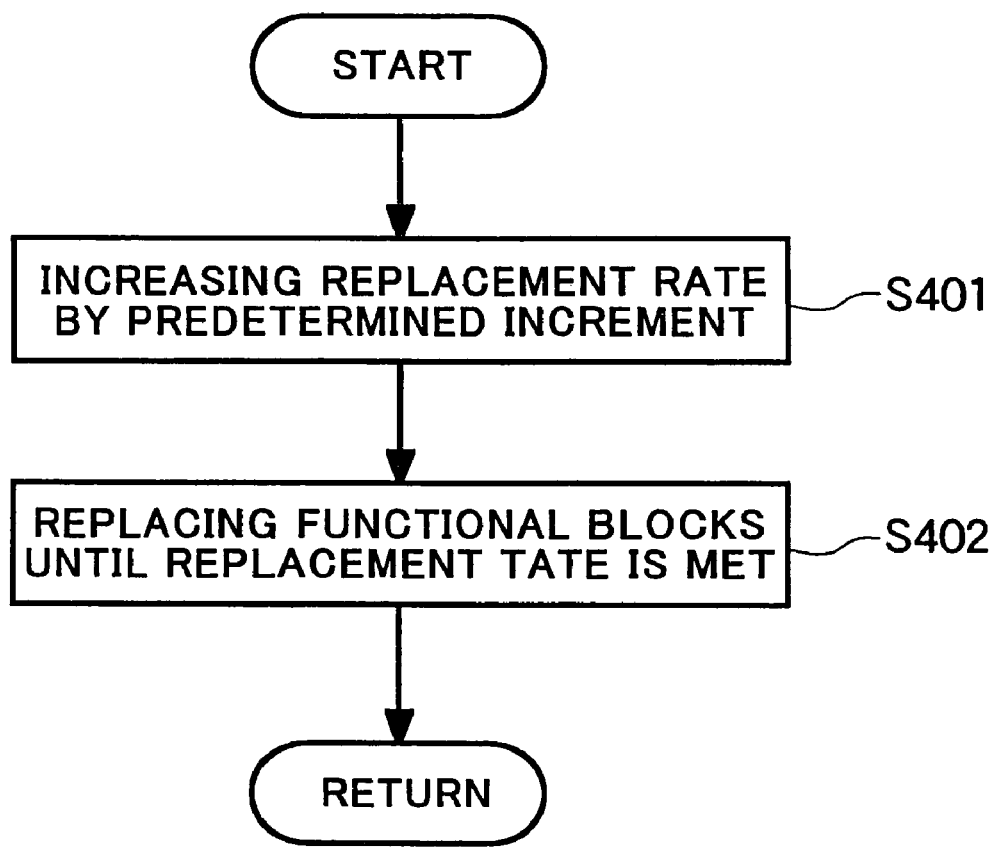
FIG. 7 is a flow chart showing steps to be carried out when a functional block is replaced with another functional block in the apparatus in accordance with the first embodiment of the present invention.

FIG. 7 is a flow chart showing steps to be carried out when the functional blocks are replaced with other functional blocks in steps S305 and S312.

Hereinbelow is explained in detail the replacement of the functional blocks with other functional blocks.

As illustrated in FIG. 7, in the step of replacing the functional blocks with other functional blocks, the controller 110 first acts as the replacement rate controller 118 to increase a present replacement rate by a predetermined increment stored in the priority level library 104, in step S401.

As shown in FIG. 4, a unit by which the replacement rate stored in the priority level library database 104 is increased is 0.1% in the first embodiment. Accordingly, the replacement rate which is initially set equal to zero (0) is increased to 0.1% in the first replacement of the functional blocks.

The replacement rate is increased by the predetermined increment (0.1% in the first embodiment) each time the replacement of the functional blocks is carried out.

Then, the controller 110 repeatedly replaces a functional block to which an on-chip capacitor having a first capacity is added with a functional block to which an on-chip capacitor having a second capacity smaller than the first capacity is added, in an order from a functional block having a lower priority level to a functional block having a higher priority level, until functional blocks in a number corresponding the replacement rate administrated by the replacement rate controller 118 are replaced with other functional blocks, in step S402. The replacement in step S402 is carried out with reference to the priority level library database 104.

Figure 8:
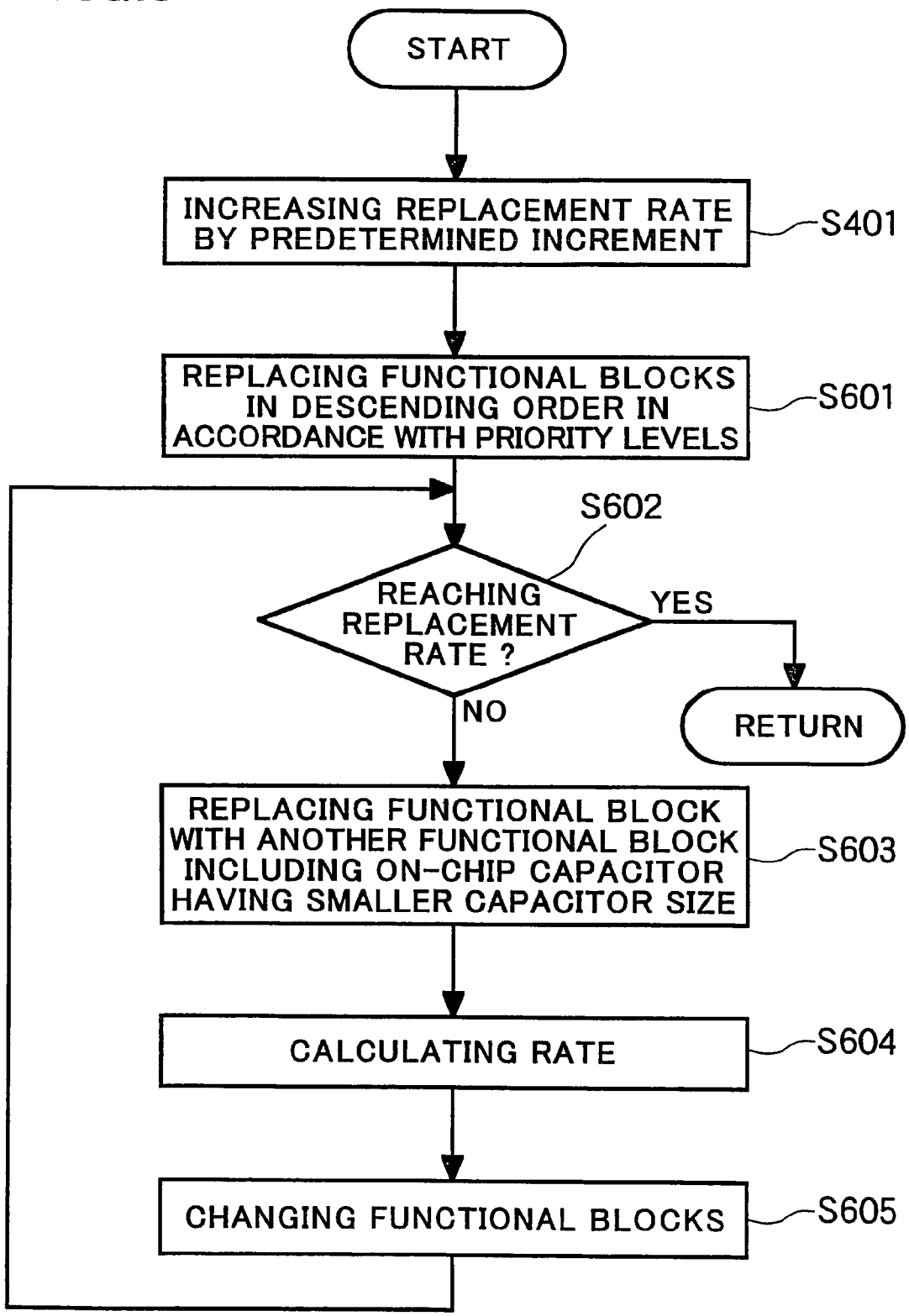
FIG. 8 is a flow chart showing steps to be carried out when a functional block is replaced with another functional block in the apparatus in accordance with the first embodiment of the present invention.

FIG. 8 is a flow chart showing steps to be carried out when the functional blocks are replaced with other functional blocks, in more detail than FIG. 7.

Hereinbelow is explained in more detail the replacement of the functional blocks with other functional blocks with reference to FIG. 8.

As illustrated in FIG. 8, the controller 110 first acts as the replacement rate controller 118 to increase a present replacement rate by a predetermined increment stored in the priority level library database 104, in step S401, similarly to the step S401 shown in FIG. 7.

Then, the controller 110 acts as the functional block re-arranger 119 to replace or sort functional blocks stored in the net-list database 101, in a descending order in accordance with priority levels stored in the priority level library database 104, in step S601.

For instance, as shown in FIG. 4, assuming that a first inverter circuit, a first NAND circuit and a second NAND circuit are designed to have a first priority level, a second inverter circuit is designed to have a second priority level, a third inverter circuit is designed to have a third priority level, and first and second flip-flops are designed to have a fourth priority level, these functional blocks are re-arranged or sorted in an order of the first flip-flop, the second flip-flop, the third inverter circuit, the second inverter circuit, the first inverter circuit, the first NAND circuit, and the second NAND circuit.

If a plurality of functional blocks has the same priority level, such as the first inverter circuit, the first NAND circuit and the second NAND circuit, they may be arranged in an order of being listed up in the net list, or may be arranged randomly.

The re-arrangement of the functional blocks is carried out only in the first replacement of the functional blocks with other functional blocks (step S305 or S312).

It should be noted that the functional blocks are replaced in step S601 merely for determining an order in which the functional blocks are subsequently processed.

Then, the controller 110 acts as the functional block replacement unit 117 to determine a functional block appearing first in the order as a functional block to be replaced with another functional block.

Then, the functional block replacement unit 117 judges whether a rate at which the functional blocks have been replaced with other functional blocks until then reaches a replacement rate administrated by the replacement rate controller 118, in step S602.

Since no functional blocks are replaced with other functional blocks when the judgment in step S602 is first carried out, it is judged that a number of functional blocks corresponding to the replacement rate (for instance, 0.1%) is not replaced with other functional blocks (NO in step S602).

Then, the functional blocks to each of which an on-chip capacitor having a first capacity is added are replaced with functional blocks each of which an on-chip capacitor having a second capacity smaller by one rank than the first capacity is added, in step S603.

If a plurality of functional blocks are to be replaced with other functional blocks, those functional blocks are replaced simultaneously with other functional blocks.

If it is no longer possible to replace the functional blocks with other functional blocks to which on-chip capacitors having a smaller capacity or size are added (for instance, if the functional blocks have been already replaced with the functional blocks 801 to which no on-chip capacitor is added, or if the functional blocks have been already replaced with the functional blocks to which an on-chip capacitor having a minimum capacity is added, because the functional blocks 801 are not prepared), the replacement is not carried out in step S603.

Then, the replacement rate controller 118 counts a total number of the functional blocks which have been replaced with other functional blocks until then, and calculates a rate defined as X/Y wherein X indicates the thus counted total number of the functional blocks, and Y indicates a total number of functional blocks, in step S604.

Then, the functional blocks to be replaced with other functional blocks are changed into other functional blocks in accordance with the order having been defined in step S601. That is, the functional blocks to be replaced with other functional blocks are forwarded by one in the order having been defined in step S601, in step S605.

For instance, if a functional block to be replaced with another functional block was the second flip-flop, the first flip-flop is newly selected as a functional block to be replaced with another functional block.

Then, the step S602 is carried out again. Specifically, the functional block replacement unit 117 judges whether the rate defined as X/Y having been calculated in step S604 reaches a replacement rate administrated by the replacement rate controller 118.

If the functional block replacement unit 117 judges that the rate defined as X/Y having been calculated in step S604 reaches a replacement rate administrated by the replacement rate controller 118 (YES in step S602), the subsequent steps shown in FIG. 6 are carried out.

Until the rate defined as X/Y is judged to reach a replacement rate administrated by the replacement rate controller 118, that is, as long as the functional block replacement unit 117 judges that the rate defined as X/Y does not reach a replacement rate administrated by the replacement rate controller 118 (NO in step S602), the steps S603, S604, S605 and S602 are repeatedly carried out.

In a process of repeatedly carrying out the steps S603, S604, S605 and S602, a functional block first appearing in the order defined in the step S601 is replaced with a functional block smaller in size by one rank than the firstly mentioned functional block, if a capacitor smaller in size than a presently selected capacitor can be selected.

If a replacement rate does not reach a target rate even if the above-mentioned replacement is carried out, a functional block second appearing in the order defined in the step S601 is replaced with a functional block smaller in size by one rank than the firstly mentioned functional block, if a capacitor smaller in size than a presently selected capacitor can be selected.

If a replacement rate does not reach a target rate even if a functional block finally appearing in the order defined in the step S601 is replaced with a functional block smaller in size by one rank than the firstly mentioned functional block, the functional block first appearing in the order defined in the step S601 is replaced with a functional block smaller in size by two ranks than the initial functional block.

The replacement as mentioned above is repeatedly carried out.

If a replacement rate does not reach a target rate even if a functional block finally appearing in the order defined in the step S601 is replaced with a functional block smaller in size by two ranks than the firstly mentioned functional block, the functional block first appearing in the order defined in the step S601 is replaced with a functional block smaller in size by three ranks than the initial functional block.

Similarly, unless a replacement rate reaches a target rate, the replacement is carried out for functional blocks subsequently appearing in the order defined in the step S601.

In accordance with the first embodiment, as long as requirements such as a delay and/or a density are satisfied, an on-chip capacitor having a maximum capacity is disposed either adjacent to a functional block.

Specifically, for instance, there are prepared a plurality of libraries of capacitor/blocks each comprised of a functional block and an on-chip capacitor disposed adjacent to the functional block.

The libraries are associated with functional blocks having different functions from one another, and further with on-chip capacitors having different sizes from one another. For instance, assuming that there are M functional blocks having different functions from one another and N on-chip capacitors having different sizes from one another, there would be MN libraries.

A layout of functional blocks is designed through the use of the libraries. If the layout fails to meet the requirements such as arrangement and/or delay, a functional block to which an on-chip capacitor having a first size or capacity is replaced with a functional block to which an on-chip capacitor having a second size or capacity smaller than the first size or capacity.

Since an on-chip capacitor disposed adjacent to a functional block is preferentially selected as long as the requirements are satisfied, it would be possible to arrange an on-chip capacitor adjacent to a functional block as much as possible.

Accordingly, maximum performances of an on-chip capacitor can be accomplished, ensuring that problems such as malfunction and deterioration in delay both caused by electrical noises can be solved.

Even if the requirements such as accommodation capacity and delay are not satisfied, a capacitor/block including an on-chip capacitor having a first capacity is replaced with a capacitor/block including an on-chip capacitor having a second capacity smaller than the first capacity, and hence, the delay and accommodation capacity are not deteriorated.

In the first embodiment, a functional block to which an on-chip capacitor having a first size or capacity is added is replaced with a functional block to which an on-chip capacitor having a second size or capacity smaller by one rank than the first size or capacity is added. The replacement is carried out in an order starting from a functional block having a lowest priority level and ending at a functional block having a highest priority level.

If it is not possible to have a target functional block even if the replacement is repeatedly carried out until a functional block having a highest priority level, a functional block to which an on-chip capacitor having a first size or capacity is added is replaced with a functional block to which an on-chip capacitor having a second size or capacity smaller by two ranks than the first size or capacity is added. The replacement is carried out in an order starting from a functional block having a lowest priority level and ending at a functional block having a highest priority level.

The replacement is repeatedly carried out until a target functional block can be obtained. Hence, it would be possible to substantially uniformly dispose an on-chip capacitor adjacent to a functional block for each of functional blocks having priority levels.

Second Embodiment

An apparatus 1 for arranging functional blocks, in accordance with the second embodiment of the present invention is identical in structure with the apparatus 1 in accordance with the above-mentioned first embodiment.

Similarly to the apparatus 1 in accordance with the above-mentioned first embodiment, the apparatus 1 in accordance with the second embodiment operates in accordance with the steps illustrated in FIG. 6 except the steps S305 and S312. That is, the operation of the apparatus 1 in accordance with the second embodiment is different from the operation of the apparatus 1 in accordance with the first embodiment only in the replacement of a functional block with another functional block.

Figure 9:
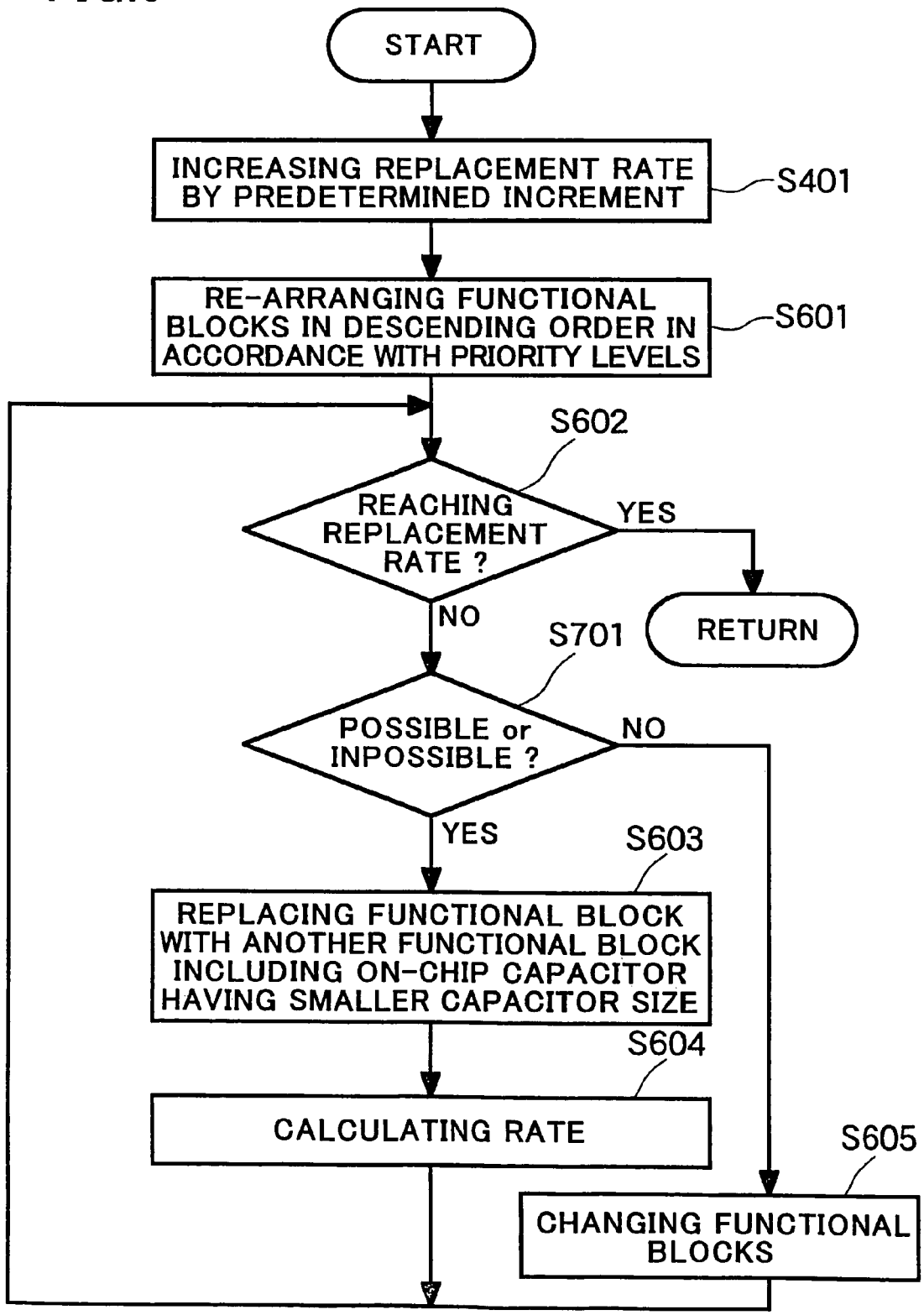
FIG. 9 is a flow chart showing steps to be carried out when a functional block is replaced with another functional block in the apparatus in accordance with the second embodiment of the present invention.

Specifically, the replacement of a functional block with another functional block in the second embodiment is carried out in accordance with the steps illustrated in FIG. 9.

FIG. 9 is a flow chart showing steps to be carried out in the replacement of a functional block with another functional block in the apparatus in accordance with the second embodiment.

Hereinbelow is explained the operation of the apparatus 1 in accordance with the second embodiment with reference to FIG. 9.

As illustrated in FIG. 9, the steps S401, S601 and S602 are carried out in the same way as the first embodiment.

In the second embodiment, following the step S602, the functional block replacement unit 117 judges whether it is possible to replace a functional block to which an on-chip capacitor having a first size or capacity is added with a functional block to which an on-chip capacitor having a second size or capacity smaller than the first size or capacity is added, in step S701.

If it is no longer possible to replace the functional blocks with other functional blocks to which on-chip capacitors having a smaller capacity or size are added (for instance, if the functional blocks have been already replaced with the functional blocks 801 to which no on-chip capacitor is added, or if the functional blocks have been already replaced with the functional blocks to which an on-chip capacitor having a minimum capacity is added, because the functional blocks 801 are not prepared), the functional block replacement unit 117 judges "impossible", and otherwise, judges "possible".

If the functional block replacement unit 117 judges "possible" (YES in step S701), a functional block to which an on-chip capacitor having a first size or capacity is added with a functional block to which an on-chip capacitor having a second size or capacity smaller than the first size or capacity is added, in step S603.

If a plurality of functional blocks are to be replaced with other functional blocks, those functional blocks may be replaced simultaneously with other functional blocks.

Then, the replacement rate controller 118 counts a total number of the functional blocks which have been replaced with other functional blocks until then, and calculates a rate defined as X/Y wherein X indicates the thus counted total number of the functional blocks, and Y indicates a total number of functional blocks, in step S604.

Then, the step S602 is carried out again. Specifically, the functional block replacement unit 117 judges whether the rate defined as X/Y having been calculated in step S604 reaches a replacement rate administrated by the replacement rate controller 118.

If the functional block replacement unit 117 judges that the rate defined as X/Y having been calculated in step S604 reaches a replacement rate administrated by the replacement rate controller 118 (YES in step S602), the subsequent steps shown in FIG. 6 are carried out.

If the functional block replacement unit 117 judges that the rate defined as X/Y having been calculated in step S604 does not reach a replacement rate administrated by the replacement rate controller 118 (NO in step S602), the step S701 and the subsequent steps are carried out again.

If the functional block replacement unit 117 judges "impossible" (NO in step S701), a functional block to be replaced with another functional block is changed into another one in accordance with the order defined in the step S601. That is, a functional block to be replaced with another functional block is forwarded by one in the order, in step S605.

Following the step S605, the steps S602 and the subsequent steps are carried out.

In the second embodiment, a functional block to which an on-chip capacitor having a first size or capacity is added is replaced with a functional block to which an on-chip capacitor having a second size or capacity smaller by one rank than the first size or capacity is added. Finally, a functional block is replaced with a functional block to which no on-chip capacitor is added. The replacement is carried out in an order starting from a functional block having a lowest priority level and ending at a functional block having a highest priority level. The replacement is repeatedly carried out until a replacement rate reaches a target rate.

In the above-mentioned first embodiment, an on-chip capacitor is uniformly added to all of functional blocks. In contrast, in the second embodiment, for instance, an on-chip capacitor is not added to a functional block having a lowest priority level, and an on-chip capacitor having a maximum capacity is added to a functional block having a highest priority level.

The second embodiment provides the same advantages as those obtained by the first embodiment. Furthermore, since a functional block to which an on-chip capacitor having a first size or capacity is added is replaced with a functional block to which an on-chip capacitor having a second size or capacity smaller by one rank than the first size or capacity is added, in an order starting from a functional block having a lowest priority level and ending at a functional block having a highest priority level, it would be possible to preferentially arrange an on-chip capacitor adjacent to a functional block having a high priority level.

Third Embodiment

Similarly to the apparatus 1 in accordance with the above-mentioned first embodiment, the apparatus 1 in accordance with the third embodiment operates in accordance with the steps illustrated in FIG. 6 except the steps S305 and S312. That is, the operation of the apparatus 1 in accordance with the third embodiment is different from the operation of the apparatus 1 in accordance with the first embodiment only in the replacement of a functional block with another functional block.

Specifically, the replacement of a functional block with another functional block in the third embodiment is carried out in accordance with the steps illustrated in FIG. 10.

FIG. 10 is a flow chart showing steps to be carried out in the replacement of a functional block with another functional block in the apparatus in accordance with the third embodiment.

Hereinbelow is explained the operation of the apparatus 1 in accordance with the third embodiment with reference to FIG. 10.

In the third embodiment, as illustrated in FIG. 10, the controller 110 first acts as the replacement rate controller 118 to increase a present replacement rate by a predetermined increment stored in the priority level library 104, in step S401, similarly to the first embodiment.

Following the step S401, the controller 110 acts as the functional block replacement unit 117 to repeatedly and randomly replace a functional block to which an on-chip capacitor having a first size or capacity is added with a functional block to which an on-chip capacitor having a second size or capacity smaller than the first size or capacity is added, regardless of priority levels, in step S502, until functional blocks are replaced with other functional blocks in number corresponding to a replacement rate administrated by the replacement rate controller 118.

The apparatus 1 for arranging functional blocks, in accordance with the third embodiment of the present invention is different in structure from the apparatus 1 in accordance with the above-mentioned first embodiment only in that the apparatus 1 in accordance with the third embodiment is not necessary to include the priority level library database 104 and the functional block re-arranger 119.

In the third embodiment, it is necessary for the memory 100 to store data indicative of a unit by which a replacement rate is increased, among the data to be stored in the priority level library database 104.

The third embodiment provides almost the same advantages obtained by the first embodiment. It should be noted that it is not possible in the third embodiment to substantially uniformly arrange on-chip capacitors adjacent to a functional block of each of priority levels, unlike the first embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2005-076404 filed on Mar. 17, 2005 including specification, claims, drawings and summary is incorporated herein by reference in its entirety.

What is claimed is:

1. A method of designing a layout of a functional block and an on-chip capacitor in a semiconductor integrated circuit, comprising:
(a) designing a layout of a capacitor/block comprised of a functional block, and an on-chip capacitor having a predetermined capacity and disposed adjacent to the functional block;
(b) judging whether the layout resulted from the step (a) satisfies predetermined requirements;
(c) designing again a layout of a capacitor/block including an on-chip capacitor having a capacity smaller than a capacity of an on-chip capacitor of the previously designed capacitor/block, only when the layout resulted from the step (a) is judged not to satisfy the predetermined requirements; and
(d) judging whether the layout resulted from the step (c) satisfies the predetermined requirements,
the steps (c) and (d) being repeatedly carried out until the layout satisfies the predetermined requirements.

2. The method as set forth in claim 1, wherein the predetermined requirements include at least one of accommodation of capacity and delay.

3. The method as set forth in claim 1, further comprising step (e) of judging, if the layout is judged not to satisfy the predetermined requirements in the step (b), whether the layout which does not satisfy the predetermined requirements, lies in a large area of an on-chip capacitor of the capacitor/block,
wherein the steps (c) and (d) are carried out when it is judged in the step (e) that when the layout which does not satisfy the predetermined requirements, lies in a large area of the on-chip capacitor.

4. The method as set forth in claim 1, further comprising step (f) of preparing a plurality of libraries for each of capacitor/blocks each including on-chip capacitors having capacities different from one another in association with each of functional blocks,
wherein a library of a capacitor/block including an on-chip capacitor having a maximum capacity in each of functional blocks is selected, and then, a layout is designed in the step (a), and
the library is replaced with a library of a capacitor/block including an on-chip capacitor having a capacity smaller than the maximum capacity, in a certain functional block among the functional blocks, and then, a layout is designed in the step (c)

5. The method as set forth in claim 4, wherein the step (c) includes:
(c1) setting one of a number of functional blocks in which a library should be replaced with another library having a capacitor/block including an on-chip capacitor having a smaller capacity, and a target rate defined as X/Y wherein X indicates a total number of functional blocks in which a library should be replaced with functional blocks of another library of a capacitor/block including an on-chip capacitor having a smaller capacity, and Y indicates a total number of functional blocks; and (c2) repeating the replacement of a library until the number of functional blocks is replaced with the another library or until the target rate is accomplished.

6. The method as set forth in claim 5, wherein the target rate is increased by a predetermined rate in the step (c1) each time the step (c) is carried out.

7. The method as set forth in claim 5, further comprising step (g) of assigning priority level to each of functional blocks, wherein, in the step (c2), a library is replaced with another library of a capacitor/block including an on-chip capacitor having an immediately smaller capacity in an order of a functional block having a smaller priority level among the functional blocks, in a case that the target rate is not accomplished even if the replacement of a library is repeatedly carried out for a functional block having a smallest priority level to a functional block having a highest priority level, the replacement, of a library with another library of a capacitor/block including an on-chip capacitor having a second immediately smaller capacity in an order of a functional block having a smaller priority level among the functional blocks, is carried out until the target rate is accomplished.

8. The method as set forth in claim 5, further comprising step (g) of assigning priority level to each of functional blocks, wherein, in the step (c2), a library is replaced with another library of a capacitor/block including an on-chip capacitor having an immediately smaller capacity in a functional block having a first priority level, in a case that the target rate is not accomplished even if the functional block having the first priority level is replaced with a library of a capacitor/block including an on-chip capacitor having a minimum capacity, the replacement, of a library with another library of a capacitor/block including an on-chip capacitor having a second priority level immediately higher than the first priority level, is carried out.

9. The method as set forth in claim 5, wherein the replacement is repeatedly carried out in the step (c2) randomly in each of the functional blocks, until the target rate is accomplished.

10. A computer readable medium, embedded thereon a program for causing a computer to carry out a method of designing a layout of a functional block and an on-chip capacitor in a semiconductor integrated circuit, said method comprising steps executed by the computer in accordance with the program including:

(a) designing a layout of a capacitor/block comprised of a functional block, and an on-chip capacitor having a predetermined capacity and disposed adjacent to the functional block;

(b) judging whether the layout resulted from the step (a) satisfies predetermined requirements;

(c) designing again a layout of a capacitor/block including an on-chip capacitor having a capacity smaller than a capacity of an on-chip capacitor of the previously designed capacitor/block, only when the layout resulted from the step (a) is judged not to satisfy the predetermined requirements; and (d) judging whether the layout resulted from the step (c) satisfies the predetermined requirements, the steps (c) and (d) being repeatedly carried out until the layout satisfies the predetermined requirements.

11. A method of fabricating a semiconductor integrated circuit including a functional block and an on-chip capacitor both formed on a substrate or an electrically insulating layer, comprising:

arranging the functional block and the on-chip capacitor on the substrate or the electrically insulating layer in accordance with a layout, the layout being determined by:

(a) designing a layout of a capacitor/block comprised of a functional block, and an on-chip capacitor having a predetermined capacity and disposed adjacent to the functional block;

(b) judging whether the layout resulted from the step (a) satisfies predetermined requirements;

(c) designing again a layout of a capacitor/block including an on-chip capacitor having a capacity smaller than a capacity of an on-chip capacitor of the previously designed capacitor/block, only when the layout resulted from the step (a) is judged not to satisfy the predetermined requirements; and (d) judging whether the layout resulted from the step (c) satisfies the predetermined requirements, the steps (c) and (d) being repeatedly carried out until the layout satisfies the predetermined requirements.

12. An apparatus for designing a layout of a functional block and an on-chip capacitor in a semiconductor integrated circuit, comprising:

(a) a placer which designs a layout of a capacitor/block comprised of a functional block, and an on-chip capacitor having a predetermined capacity and disposed adjacent to the functional block;

(b) a judgment device which judges whether the layout determined by the placer satisfies predetermined requirements; and (c) a replacement device which replaces an on-chip capacitor with another on-chip capacitor having a smaller capacity, when the layout is judged not to satisfy the predetermined requirements, wherein the placer, only when the layout is judged not to satisfy the predetermined requirements, designs a layout of a capacitor/block including an on-chip capacitor having a capacity smaller than a capacity of an on-chip capacitor of the previously designed capacitor/block.

13. The apparatus as set forth in claim 12, wherein the judgment device includes at least one of a first device which judges whether the layout designed by the placer satisfies accommodation capacity, and a second unit which judges whether the layout designed by the placer satisfies delay.

14. The apparatus as set forth in claim 12, further comprising a judgment device which judges, if the layout is judged not to satisfy the predetermined requirements, whether the layout which does not satisfy the predetermined requirements, lies in a large area of an on-chip capacitor of the capacitor/block, wherein replacement device, when the layout which does not satisfy the predetermined requirements, is judged to lie in a large area of an on-chip capacitor of the capacitor/block, replaces an on-chip capacitor with another on-chip capacitor having a smaller capacity.

15. The apparatus as set forth in claim 12, further comprising a library database storing therein a plurality of libraries for each of capacitor/blocks each including on-chip capacitors having capacities different from one another in association with each of functional blocks, wherein the placer designs a layout, selecting a library of a capacitor/block including an on-chip capacitor having a maximum capacity in each of functional blocks, and the replacement device replaces the library with a library of a capacitor/block including an on-chip capacitor having a capacity smaller than the maximum capacity, in a certain functional block among the functional blocks.

16. The apparatus as set forth in claim 15, further comprising a target-rate setting device which determines one of a number of functional blocks in which a library should be replaced with another library a capacitor/block including an on-chip capacitor having a smaller capacity, and a target rate being defined as X/Y wherein X indicates a number of functional blocks in which a library should be replaced with another library of a capacitor/block including an on-chip capacitor having a smaller capacity, and Y indicates a total number of functional blocks, wherein the replacement device repeats the replacement of a library until the total number of functional blocks is replaced with the another library or until the target rate is accomplished.

17. the apparatus as set forth in claim 16, further comprising priority level database storing therein a priority level of each of the functional blocks, wherein the replacement device replaces a library with another library of a capacitor/block including an on-chip capacitor having an immediately smaller capacity in an order of a functional block having a smaller priority level among the functional blocks, in a case that the target rate is not accomplished even if the replacement of a library is repeatedly carried out for a functional block having a smallest priority level to a functional block having a highest priority level, the replacement device carries out the replacement of a library with another library of a capacitor/block including an on-chip capacitor having a second immediately smaller capacity in an order of a functional block having a smaller priority level among the functional blocks, until the target rate is accomplished.

18. The apparatus as set forth in claim 16, further comprising priority level database storing therein a priority level of each of the functional blocks, wherein the replacement device replaces a library with another library of a capacitor/block including an on-chip capacitor having an immediately smaller capacity in a functional block having a first priority level, in a case that the target rate is not accomplished even if the functional block having the first priority level is replaced with a library of a capacitor/block including an on-chip capacitor having a minimum capacity, the replacement device carries out the replacement of a library with another library of a capacitor/block including an on-chip capacitor having a second priority level immediately higher than the first priority level.

19. The apparatus as set forth in claim 16, wherein the replacement device repeatedly carries out the replacement randomly in each of the functional blocks, until the target rate is accomplished.

* * * * *